United States Patent [19]

Schreilechner

[11] Patent Number: 4,742,315
[45] Date of Patent: May 3, 1988

[54] INTEGRATED NMOS CIRCUIT

[75] Inventor: Peter Schreilechner, Ossiach, Austria

[73] Assignee: Siemens Aktiengesellschaft, Berlin and Munich, Fed. Rep. of Germany

[21] Appl. No.: 43,836

[22] Filed: Apr. 28, 1987

[30] Foreign Application Priority Data

Apr. 28, 1986 [DE] Fed. Rep. of Germany ....... 3614316

[51] Int. Cl.$^4$ .......................... H03K 3/00; H03K 3/33
[52] U.S. Cl. ................................ 331/108 C; 331/111; 331/143; 331/177 R
[58] Field of Search .................... 331/108 C, 111, 143, 331/177 R

[56] References Cited

U.S. PATENT DOCUMENTS

| | | |
|---|---|---|
| 3,904,988 | 9/1975 | Hsiao ..................................... 331/111 |
| 4,321,561 | 3/1982 | Payne et al. ......................... 331/111 |
| 4,623,852 | 11/1986 | Abou et al. ........................... 331/111 |
| 4,652,837 | 3/1987 | D'Arrigo et al. ................ 331/143 X |

FOREIGN PATENT DOCUMENTS

| | | |
|---|---|---|
| 3017928 | 11/1980 | Fed. Rep. of Germany . |
| 2049535 | 3/1971 | France . |
| 58-29217 | 2/1983 | Japan . |
| 58-165414 | 9/1983 | Japan . |

OTHER PUBLICATIONS

IEEE Journal of Solid State Circuits, vol. SC-13, No. 3, Jun. 1978, p. 32.

*Primary Examiner*—Eugene R. LaRoche
*Assistant Examiner*—David Mis
*Attorney, Agent, or Firm*—Herbert L. Lerner; Laurence A. Greenberg

[57] ABSTRACT

An integrated NMOS circuit includes an external connection terminal to be connected to an external component, a control voltage terminal, a supply voltage terminal, a reference voltage terminal, a circuit output terminal, a voltage controlled transistor network having an input connected to the control voltage terminal and an output connected to the external connection terminal, a control device supplied by a voltage source through the supply voltage terminal and the reference voltage terminal, the control device having an input connected to the voltage controlled transistor network and an output fed back to the transistor network and connected to the circuit output terminal, the transistor network including a switchable charging current source and a switchable controlled discharging current source, the switchable controlled discharging current source being controlled by a control voltage connected to the control voltage terminal, the switchable charging current source and the switchable controlled discharging current source being switched by the control device in antivalent manner.

15 Claims, 3 Drawing Sheets

INTEGRATED NMOS CIRCUIT

The invention relates to an integrated NMOS-circuit being supplied by a voltage source through a supply voltage terminal and a reference voltage terminal with a voltage controlled transistor network connected to a control voltage terminal, the voltage controlled transistor network being connected on the output side to a first terminal for connection of an external component, especially a capacitor, and to an input of a control device, the output of the control device being fed back to the transistor network and being connected to a circuit output terminal.

Such a circuit is particularly well suited as a voltage-controlled oscillator (VCO) for connecting an external capacitor. Customarily, voltage-controlled oscillators have a frequency-determining capacitor which is charged and discharged in dependence on a control voltage and thus generates a voltage-controlled frequency. Using complementary transistors, such a circuit can be constructed relatively simply. Difficulties are encountered if only transistors of one type are available.

In integrated circuits with NMOS transistors, a frequency-determining external capacitor is customarily charged and discharged through a voltage-controlled resistor which is constructed as a transistor network. The charging voltage is fed back through a comparator with an inverter which determines the flipping time of the circuit through a comparison with a reference voltage. The disadvantage of such a circuit is that an inherent non-linearity of the frequency of the VCO is present as a function to the control voltage over the entire driving range and that therefore, the sensitivity, i.e. the ratio of the frequency change to the voltage change, is also non-linear. A typical sensitivity curve for a frequency normalized for the rest frequency of the VCO as a function of the control voltage is shown in the curve 1 of FIG. 4 of the drawing to be explained in more detail below.

It is accordingly an object of the invention to provide an integrated NMOS circuit, which overcomes the hereinafore-mentioned disadvantages of the heretofore-known devices of this general type and through which a voltage-controlled oscillator can be provided upon the connection of an external capacitor, with a frequency that is largely linearly dependent on the control voltage over the driving range and with a sensitivity which is largely constant in the entire driving range.

With the foregoing and other objects in view there is provided, in accordance with the invention, an integrated NMOS circuit, comprising an external connection terminal to be connected to an external component, especially a capacitor, a control voltage terminal, a supply voltage terminal, a reference voltage terminal, a circuit output terminal, the integrated NMOS circuit being supplied by a voltage source through the supply voltage terminal, and the reference voltage terminal, a voltage controlled transistor network having an input connected to the control voltage terminal and an output connected to the external connection terminal, a device having an input connected to the voltage controlled transistor network and an output fed back to the transistor network and connected to the circuit output terminal, the transistor network including a switchable charging current source and a switchable controlled discharging current source, the switchable controlled discharging current source being controlled by a control voltage connected to the control voltage terminal, the switchable charging current source and the switchable controlled discharging current source being switched by the control device in antivalent manner.

The essence of the invention is to obtain a discharge time of a capacitor which can be connected externally to the integrated circuit, that is dependent linearly on the control voltage, by means of a voltage-controlled current source, and to keep the charging time constant over all frequencies. The charging time is kept small as compared to the period by using a charging current source which is independent of the control voltage. The integrated circuit according to the invention thus assures a linear relationship between the control voltage and the frequency of the VCO upon the connection of an external capacitor. The circuit has the further advantage that it requires little effort in term of construction.

In accordance with another feature of the invention, the switchable charging current source includes a switchable transistor having a control input for switching the switchable transistor and output terminals each being connected to a respective one of the supply voltage terminal and the external connection terminal.

In accordance with a further feature of the invention, the switchable transistor of the charging current source has a large ratio of channel width to channel length.

In accordance with an added feature of the invention, the switchable discharging current source includes a current reflector connected to the control voltage terminal, the current reflector being formed of two transistors including an output transistor having an output circuit, and the current reflector having an input circuit in which a reference current proportional to the control voltage is generated and reflected to the output circuit of the output transistor of the current reflector.

In accordance with an additional feature of the invention, the current reflector includes a series circuit formed of a resistor and a transistor connected as a diode, and the input circuit of the current reflector includes a control transistor having a control input connected to the control voltage terminal and output terminals each being connected to a respective one of the supply voltage terminal and the series circuit.

In accordance with yet another feature of the invention, the two transistors of the current reflector have input circuits, and including a switching transistor through which the switchable discharging current source is switched, the switching transistor having a control input and having an output circuit connected in parallel with the input circuits of the transistors of the current reflector.

It is a further object to provide a compensation of temperature and supply voltage variations.

Therefore, in accordance with yet a further feature of the invention, the switchable discharging current source includes a circuit for compensating temperature and supply voltage changes.

In accordance with yet an added feature of the invention, there is provided a voltage divider connected to the supply voltage terminal, the voltage divider being formed of a depletion transistor connected as a resistor and a polysilicon resistor with a divider point therebetween, and another current reflector connected to the divider point, the other current reflector being formed of two further transistors and an output transistor with an output circuit, the other current reflector having an input circuit in which a temperature and supply voltage-dependent current is generated and reflected onto the output circuit of the output transistor of the other current reflector.

In accordance with yet an additional feature of the invention, there is provided a transistor connected as a diode and connected to the reference voltage terminal, another depletion transistor connected as a resistor and connected in series with the transistor connected as a diode defining a junction point therebetween, and another control transistor connected to the transistor connected as a diode and the other depletion transistor and being controlled by the divider point of the voltage divider, the two further transistors of the other current reflector being in the form of a transistor connected as a diode and a further control transistor having an output circuit, the input circuit of the other current reflector including a further depletion transistor connected to the supply voltage terminal and connected as a resistor in series with the transistor of the second current reflector connected as a diode and the output circuit of the further control transistor, the further control transistor having a control input connected to the junction point.

In accordance with still another feature of the invention, the output circuits of the output transistors of the current reflectors and the switchable transistor of the switchable charging current source are connected in series.

In accordance with still a further feature of the invention, there is provided a voltage divider for level adapting through which the control input of the control transistor is connected to the control voltage terminal.

In accordance with still an added feature of the invention, the voltage divider includes a series circuit formed of a depletion transistor connected as a resistor and a level transistor connected as a diode defining a first junction point therebetween connected to the control input of the control transistor, and another depletion transistor connected as a resistor and connected in series with the level transistor defining a second junction point therebetween connected to the control voltage terminal.

In accordance with still an additional feature of the invention, there is provided an output driver connected to the circuit output terminal, the control device including a Schmitt trigger with an inverter having an input connected to the external connection terminal and an output, and a driver being connected between the output of the Schmitt trigger with an inverter and the control inputs of the switchable transistor of the charging current source and the switching transistor and being connected to the output driver.

In accordance with a concomitant feature of the invention, the voltage controlled transistor network includes a charging and discharging current source, the output driver has an input, the Schmitt trigger with an inverter has an output, and including additional transistors, a switching terminal, a disconnect and switching device controlled through the switching terminal for disconnecting the driver and the charging and discharging current source as far as a signal is concerned and for connecting the input of the output driver to the external connection terminal while connecting the input circuits of the transistors of the current reflector and the output of the Schmitt trigger with an inverter through respective ones of the additional transistors to the reference voltage terminal, and a transistor switching device through which the input of the output driver is switched through from the output of the driver to the external connection terminal.

Other features which are considered as characteristic for the invention are set forth in the appended claims.

Although the invention is illustrated and described herein as embodied in an integrated NMOS circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
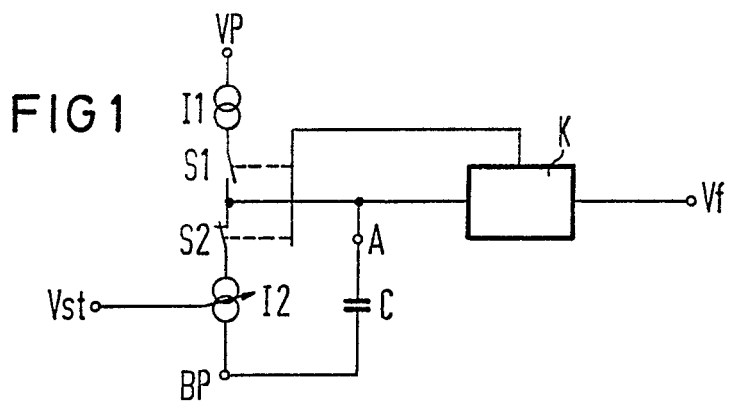
FIG. 1 is a schematic circuit diagram of an integrated circuit according to the invention with an externally connected capacitor.

Referring now to the figures of the drawings in detail and first, particularly, to FIG. 1 thereof, there is seen a basic block diagram of a voltage-controlled oscillator with a circuit integrated according to the invention, and a capacitor C connected between a terminal A and a reference voltage terminal BP. The capacitor C determines the frequency of the voltage-controlled oscillator (VCO) and is charged and discharged by switchable current sources I1 and I2. A control network K serves for controlling switches S1 and S2. In detail, the control voltage is fed to a control voltage terminal Vst which is connected to the current source I2 in order to control the current of the current source. One pole of the current source I2 is connected to the reference voltage terminal BP and the other pole is connected to one contact of the series-connected switch S2. The other contact of the switch S2 is connected to one contact of the series-connected switch S1, while the other contact of the switch S1 is connected to one pole of the current source I1 which is again connected in series and has another pole connected to a supply voltage terminal VP.

The junction point between the two switches S1 and S2 is connected to the terminal A to which the capacitor C is connected, and the junction point is also connected to the input of the control network K which is shown as a block. One output of the control network K is connected to an output terminal Vf of the integrated circuit, while the other output of the control network K controls the switch positions of the switches S1 and S2. According to FIG. 1, the switch S1 is open and the switch S2 is closed, so that the capacitor C is discharged through the current source I2 in dependence on the control voltage.

By closing the switch S1 and opening the switch S2, the capacitor C is charged independently of the control voltage. In order to prevent a shunt current, the switches S1 and S2 must be switched on and off in an anti-valent manner. Preferably, the control network K therefore contains a Schmitt trigger with inverters, the output or outputs of which are connected to the control elements of the switches S1 and S2 and the output terminal Vf.

In order to obtain a short charging time of the capacitor for all frequencies, the current through the charging current source I1 must be large. On the other hand, the capacitor is discharged over a longer time with a small control voltage, than with a high control voltage. Therefore, the input of the control network K receives a saw-tooth voltage with a rising time which is the same for all frequencies but with a control-voltage-dependent dwelling time. A Schmitt trigger provided in the control network converts the saw-tooth voltage present at the input into a square-wave voltage of the same frequency.

Figure 2:
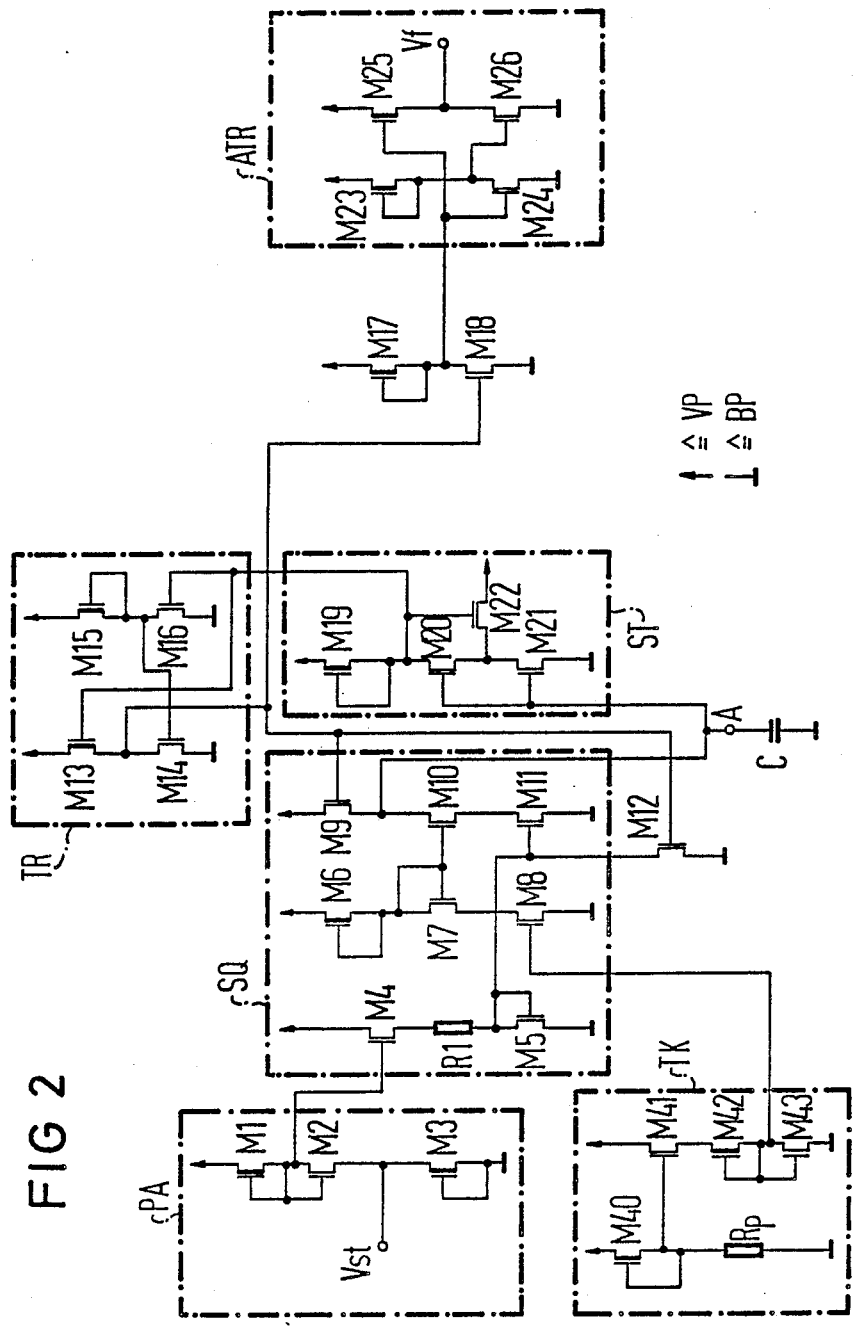
FIG. 2 is a circuit diagram of a concrete embodiment of an integrated circuit according to the invention with an externally connected capacitor.
Figure 3:
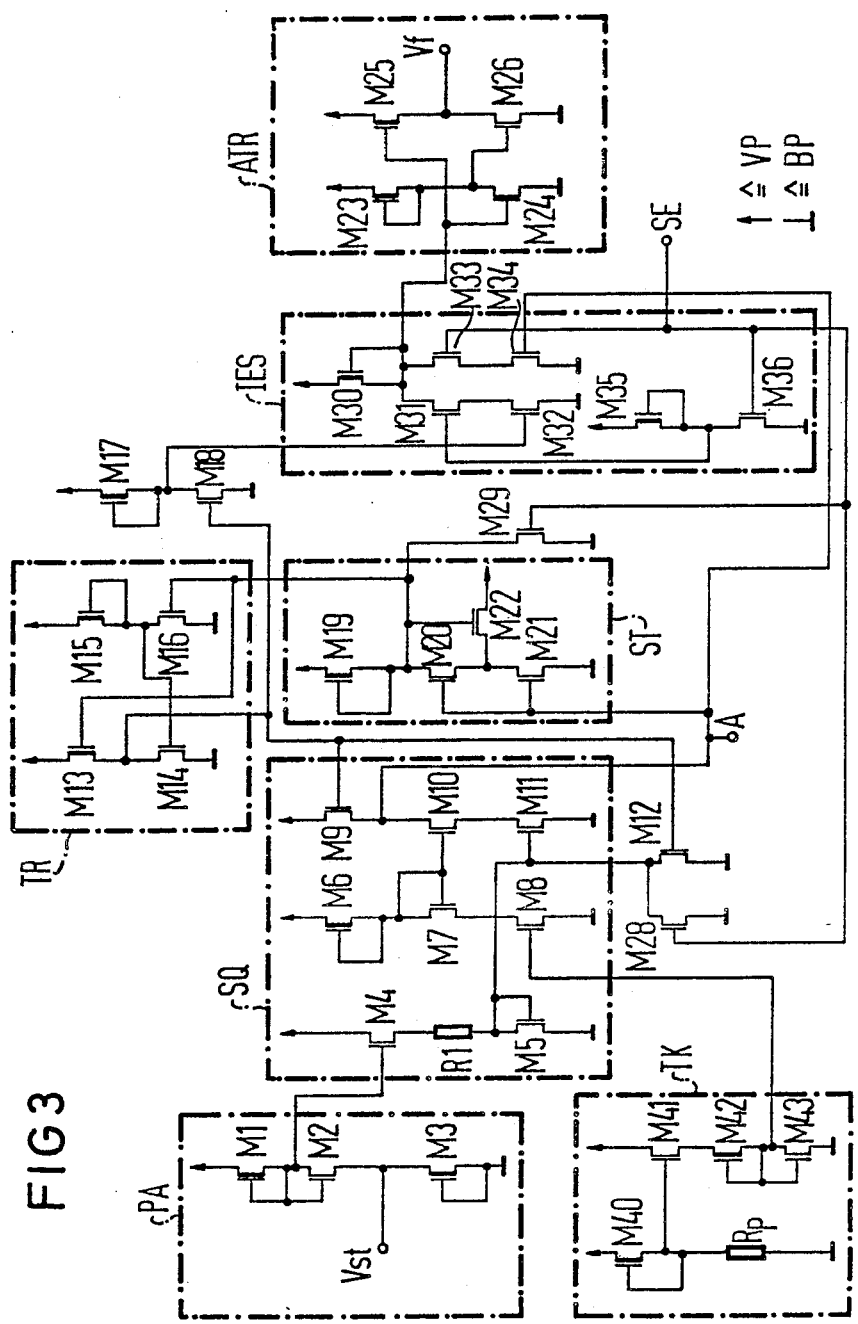
FIG. 3 is a circuit diagram of a concrete embodiment of an integrated circuit according to the invention with a disconnect and switching device.

FIGS. 2 and 3 include legends showing that the supply voltage terminal VP and the reference voltage terminal BP are represented by reference symbols in the drawings.

FIG. 2 shows a circuit diagram of a voltage-controlled oscillator with a concrete embodiment of an integrated circuit according to the invention having an externally connected capacitor. According to the field of the invention, only MOS transistors of the n-channel type are used as the enhancement and depletion transistors. In order to increase the clarity of the circuit diagram, individual circuit portions are framed by dotted lines. Each of the circuit portions fulfill a given function. It is assumed that the voltage-controlled oscillator in the illustrated embodiment of FIG. 2 has a rest frequency of $f_o = 4$ MHz, for instance, which can be adjusted by the capacity of the external capacitor C which is assumed to have a value of 10 to 50 pF. The circuit portions PA, SQ and TK form a transistor network.

A current source SQ must furnish a rest current on the basis of the given rest frequency $f_o$ which corresponds to the operating point of the VCO. The rest current is derived from the control voltage connected to the control voltage terminal Vst through a level adapter PA. The driving range of the circuit moves between control voltage values of 0 and 4 V.

A level matching for the voltage controlling the rest current, referred to the control voltage of 1.9 volts at an operating point of 4 MHz, is accomplished by means of a voltage divider chain which is connected between the supply voltage terminals VP and BP and is formed by transistors M1–M3. The transistors M1 and M3 are transistors of the depletion type which are connected as resistors and in which the source and gate are connected to each other. The transistor M2 which is connected as a diode is connected in series between the output circuits of the transistors M1 and M3. The transistor M2 is of the enhancement type. The control voltage terminal Vst is connected to the junction point of the output circuits of the transistors M2 and M3, and a transistor forming a control input M4 of the current source SQ is connected to the junction point between the output circuits of the transistors M1 and M2. The current source SQ contains a switchable charging current source and a switchable discharging current source; the discharging current source furthermore provides the possibility of compensating for temperature and supply voltage variations. Simple current reflectors are provided as the base elements for the discharging current source. The conversion of the level-matched control voltage into a proportional current is accomplished through the input circuit of a first current reflector formed by transistors M4 and M5 and a resistor R1. The level-matched control voltage is fed to the gate of the transistor M4. The output terminals of the transistors M4 are connected on one hand to the supply voltage terminal VP and on the other hand through the resistor R1 to the transistor M5 which is connected as a diode and is connected to the reference voltage terminal BP.

For linear behavior it is necessary for the transistor M4 to operate in an unsaturated region. The transistor M5 and the resistor R1 must be selected accordingly. The current flowing in the input circuit of the current reflector is then reflected on the current path with the transistors M10, M11 and the capacitor C. The output circuit of the transistor M10 is connected in series with the output circuit of the reflector transistor M11 of the first current reflector. The transistor M10 is the reflector transistor of a second current reflector, the input circuit of which contains transistors M6 to M8 which have output circuits that are connected in series. The transistor M6 is a depletion transistor which is connected to the supply voltage terminal VP and is connected as a resistor. The transistor M6 is connected through the resistor M7, which is connected as a diode, to the transistor M8, the free terminal of which is connected to the reference voltage terminal BP. The control terminals of the transistors M7 and M10 are connected to each other, so that these transistors form the second current reflector.

Conventional current reflectors require the current reflector circuit in question to operate in the saturation region. This is the case if the gate-source voltage exceeds the transistor threshold voltage and the drain and gate are connected to each other in the transistor connected as a diode. The output resistance can be brought to a desired value by changing the channel length of the current reflector transistors. The transfer ratio of the current reflectors is determined by the ratio of the quotients of channel width and channel length of the individual transistors.

The control terminal of the transistor M8 is connected to the circuit section TK for compensating temperature and supply voltage variations. A voltage divider which is connected to the supply voltage and is formed of a depletion transistor M40 connected as a resistor and a polysilicon transistor Rp, is used as the temperature-dependent element. The divider tap point is connected to the control input of a transistor M41, the output circuit of which is connected in series with a depletion transistor M42 connected as a resistor and a transistor M43 connected as a diode. An output terminal of the transistor M41 is connected to the supply voltage terminal VP and an output terminal of the transistor M43 is connected to the reference voltage terminal BP. The junction point between the transistors M42 and M43 is tied to the control input of the transistor M8.

Due to the different temperature behavior of the cutoff voltage of the depletion transistor M40 and the polysilicon resistor Rp, a voltage shift occurs at the divider tap point of the voltage divider formed thereby and thus, a voltage shift occurs at the control input of the transistor M8 and the transistor M10. With rising temperature, the voltage at the control input of the transistor M10 becomes larger and the transistor M10 conducts more. This counteracts a transistor conductivity which becomes smaller with a temperature increase and leads to a correction of the frequency if the temperature changes.

With increasing supply voltage, the potential at the divider point of the voltage divider formed of the transistor M40 and the resistor Rp rises. The control voltage present at the reference voltage terminal BP, referred to the control voltage, therefore becomes smaller with increasing supply voltage. This counteracts the rise of the discharge current through the external capacitor C for higher supply voltages and causes a correction of the frequency if the supply voltage changes.

A transistor M9 represents the charging current source for the capacitor C. One output terminal of the transistor M9 is connected to the supply voltage terminal VP and the other output terminal of the transistor M9 is connected to an output terminal of the transistor M10. The output circuit of the transistor M10 is connected in series with the output circuit of the transistor M11. The junction point between the output circuits of the transistors M9 and M10 is connected to the terminal A, to which a terminal of the capacitor C is also connected.

Since there are no complementary transistors in an NMOS-circuit and the capacitor C is connected into the source branch of the charging transistor M9 during charging, a charging time which is proportional to the control voltage can only be provided with difficulty. The ratio of channel width to channel length is large for the transistor M9. Therefore, a proper selection of the transistor M9 permits the driving behavior of the VCO to be largely independent of the charging, if the charging is constant and the charging time is short. The VCO only deviates from linearity in the uppermost frequency range due to the constant charge.

If the capacitor C is charged by the transistor M9, the branch formed of the transistors M10 and M11 must be switched off in order to avoid a shunt current. Conversely, the transistor M9 must be switched off if the capacitor C is discharged through the transistors M10 and M11. The branch with the transistors M10 and M11 is switched off through a transistor M12, one output terminal of which is connected to the reference voltage terminal BP like the one respective output terminal of the transistors M5 and M11 of the first current reflector. The other output terminal of the transistor M12 is connected to the two control terminals of the transistors M5 and M11 which are connected to each other. If the transistor M12 is switched into conduction, the input circuits of the transistors of the first current reflector are short circuited.

The control terminals of the transistors M9 and M12 which switch the transistors, are controlled by a Schmitt trigger with an inverter ST which is followed by a driver TR, so that the Schmitt trigger with the inverter ST picks up the potential present at the terminal A. Thereby, the voltage present at the capacitor C is inverted and fed back to the switchable current source and thus the oscillator is permitted to oscillate.

The Schmitt trigger with the inverter ST contains transistors M20 and M21, having control terminals connected to the terminal A and output circuits interconnected in series. A depletion transistor M19 which has a free end connected to the supply voltage source VP and which is connected as a resistor, is furthermore connected in series with the output circuit of the transistor M20. The junction point between the transistors M19 and M20 forms the output of the Schmitt trigger with the inverter ST and is connected to the control input of a transistor M22. One output terminal of the transistor M22 is connected to the junction point between the output circuit of the transistors M20 and M21 and the other output terminal thereof is connected to the reference voltage terminal VP. The free terminal of the transistor M21 is connected to the reference voltage terminal BP. The transistors M21 and M22 form a voltage divider.

The driver TR contains two circuits with output circuits thereof interconnected in series between the supply voltage. The two circuits are formed of the transistors M13, M14 and M15, M16. The transistors M13 and M15 are of the depletion type and have free terminals connected to the supply voltage terminal VP. The transistor M15 is connected as a resistor. The free terminals of the transistors M14 and M16 are connected to the reference voltage terminal BP. The control inputs of the transistors M13 and M16 are connected to the output of the Schmitt trigger with the inverter ST and the control input of the transistor M14 is connected to the junction point between the output circuits of the transistors M15 and M16. The output of the driver TR is formed by the junction point between the output circuits of the transistors M13 and M14. On one hand, the output of the driver TR is connected to the control inputs of the transistors M9 and M12 and on the other hand, it controls an inverter formed by transistors M17 and M18. The output of the inverter formed by transistors M17 and M18 is connected to the input of an output driver ATR.

The output driver ATR contains a transistor configuration corresponding to the driver TR, wherein the transistors M13 and M25, M14 and M26, M15 and M23 as well as M16 and M24 respectively correspond to each other. The junction point between the transistors M25 and M26 is connected to the output terminal Vf of the integrated circuit according to the invention.

If the input voltage of the Schmitt trigger with the inverter ST is increased, the output goes to the value "low" if the gate source voltage at the transistor M20 becomes larger than the threshold voltage of the transistor M20. This is the case if the drain source-voltage of the transistor M21, formed by the transistors M21 and M22, drops to a value lower than the difference of the voltage present at the capacitor C and the threshold voltage of the transistor M20. The lower threshold switching is dependent on the voltage present at the capacitor C becoming smaller than or equal to the sum of the threshold voltage of the transistor M20 and the drain-source voltage of the transistor M21.

FIG. 3 shows a circuit diagram of a concrete embodiment of an integrated circuit according to the invention with a disconnect and a switching configuration. If the VCO according to FIG. 2 is an integrated component of a phase-coupled control circuit (PLL), the PLL may be required to be operated with an external VCO. A capacitor C or the externally connectable voltage-controlled oscillator is selectably connected to the terminal A. In contrast to the circuit diagram of FIG. 2, the capacitor C is therefore no longer connected to the terminal A and the circuit is expanded by the transistors M28, M29 and an internal/external circuit IES, all of which are controlled by a switching terminal SE. The elements which are the same as in FIG. 2 are provided with the same reference symbols in FIG. 3. According to the embodiment illustrated in FIG. 3, in order to disconnect the current source SQ, the control input of the first current reflector formed of the transistors M5 and M11 as well as the output of the Schmitt trigger with the inverter ST are respectively connected through the output circuits of the transistors M28 and M29 to the reference voltage terminal BP. The control inputs of the two transistors are connected to the terminal SE.

The internal/external circuit IES assures that if the current source SQ is also switched off, the output driver ATR remains switched on. To this end, the circuit IES is controlled by the terminal SE, while the inputs of the circuit are connected to the output of the inverter formed by the transistors M17 and M18 and the terminal A. The output of the circuit IES is connected to the input of the output driver ATR.

The switching is accomplished through two circuits each having two transistors with output circuits interconnected in series, which are formed by transistors M31 and M32 as well as M33 and M34. The free terminals of the transistors M32 and M34 are connected to the reference voltage terminal BP; the free terminals of the transistors M31 and M33 are connected to each other and to the input of the output driver ATR as well as to the supply voltage terminal VP through a depletion transistor M30 connected as a resistor. The control terminal SE is connected to the control input of the transistor M33 and the control terminal SE is connected through an inverter formed by transistors M35 and M36 to the control terminal of the transistor M31. The control input of the transistor M32 is connected to the output of the inverter formed by the transistors M17 and M18, while the control input of the transistor M34 is connected to the terminal A.

Figure 4:
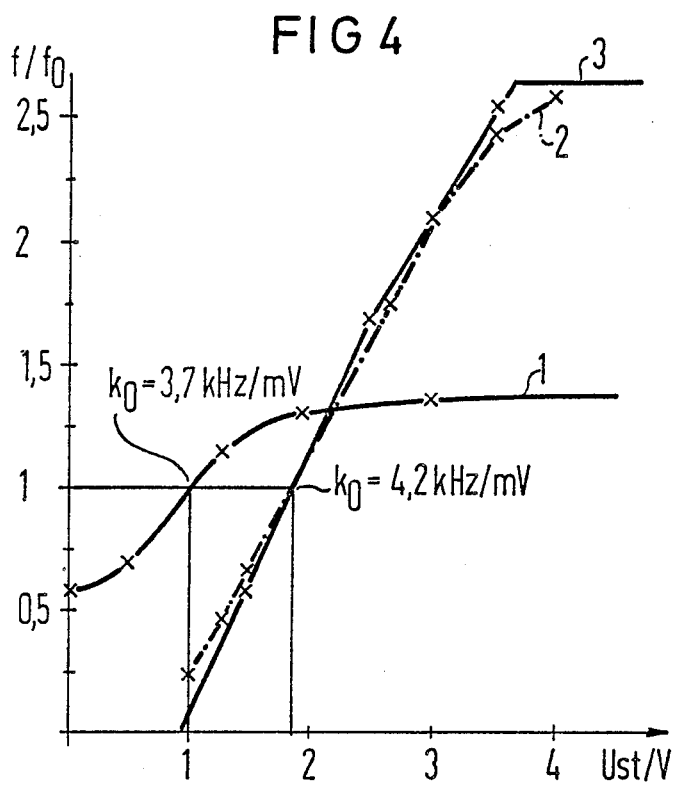
FIG. 4 is a graph showing comparison curves of a frequency normalized with respect to the rest frequency, in dependence on the control voltage of the voltage-controlled oscillator.

The graph according to FIG. 4 includes three different curves showing the dependence of a frequency f referred to a rest frequency $f_o$ on a control voltage Ust given in volts. Curve 1 shows the sensitivity of a VCO with a voltage-controlled resistor according to the state of the art about an operating point ko=3.7 kHz/mV. On the other hand, curves 2 and 3 show the sensitivity of the VCO with the integrated circuit according to the invention. Curve 2 is a measured curve, while curve 3 was formed by a computer simulation. The operating point of these two curves is at ko=4.2 kHz/mV. Curves 2 and 3 show that the sensitivity characteristic of a VCO with the integrated circuit according to the invention is linear in the region up to 2.5 times the operating frequency. The gain of such a VCO therefore always remains constant.

The foregoing is a description corresponding in substance to German Application No. P 36 14 316.2, dated Apr. 28, 1986, the International priority of which is being claimed for the instant application, and which is hereby made part of this application. Any material discrepancies between the foregoing specification and the aforementioned corresponding German application are to be resolved in favor of the latter.

I claim:
1. Integrated NMOS circuit, comprising an external connection terminal to be connected to an external component, a control voltage terminal, a supply voltage terminal, a reference voltage terminal, a circuit output terminal, a voltage controlled transistor network having an input connected to said control voltage terminal and an output connected to said external connection terminal, a control device supplied by a voltage source through said supply voltage terminal and said reference voltage terminal, said control device having an input connected to said voltage controlled transistor network and an output fed back to said transistor network and connected to said circuit output terminal, said transistor network including a switchable charging current source and a switchable controlled discharging current source, said switchable controlled discharging current source being controlled by a control voltage connected to said control voltage terminal, said switchable charging current source and said switchable controlled discharging current source being switched by said control device in antivalent manner.

2. Circuit according to claim 1, wherein said external component is a capacitor.

3. Circuit according to claim 1, wherein said switchable charging current source includes a switchable transistor having a control input for switching said switchable transistor and output terminals each being connected to a respective one of said supply voltage terminal and said external connection terminal.

4. Circuit according to claim 3, wherein said switchable transistor of said charging current source has a large ratio of channel width to channel length.

5. Circuit according to claim 3, wherein said switchable discharging current source includes a current reflector connected to said control voltage terminal, said current reflector being formed of two transistors including an output transistor having an output circuit, and said current reflector having an input circuit in which a reference current proportional to the control voltage is generated and reflected to said output circuit of said output transistor of said current reflector.

6. Circuit according to claim 5, wherein said current reflector includes a series circuit formed of a resistor and a transistor connected as a diode, and said input circuit of said current reflector includes a control transistor having a control input connected to said control voltage terminal and output terminals each being connected to a respective one of said supply voltage terminal and said series circuit.

7. Circuit according to claim 5, wherein said two transistors of said current reflector have input circuits, and including a switching transistor through which said switchable discharging current source is switched, said switching transistor having a control input and having an output circuit connected in parallel with the input circuits of said transistors of said current reflector.

8. Circuit according to claim 1, wherein said switchable discharging current source includes a circuit for compensating temperature and supply voltage changes.

9. Circuit according to claim 5, including a voltage divider connected to said supply voltage terminal, said voltage divider being formed of a depletion transistor connected as a resistor and a polysilicon resistor with a divider point therebetween, and another current reflector connected to said divider point, said other current reflector being formed of two further transistors and an output transistor with an output circuit, said other current reflector having an input circuit in which a temperature and supply voltage-dependent current is generated and reflected onto the output circuit of said output transistor of said other current reflector.

10. Circuit according to claim 9, including a transistor connected as a diode and connected to said reference voltage terminal, another depletion transistor connected as a resistor and connected in series with said transistor connected as a diode defining a junction point therebetween, and another control transistor connected to said transistor connected as a diode and said other depletion transistor and being controlled by said divider point of said voltage divider, said two further transistors of said other current reflector being in the form of a transistor connected as a diode and a further control transistor having an output circuit, said input circuit of said other current reflector including a further depletion transistor connected to said supply voltage terminal and connected as a resistor in series with said transistor of said second current reflector connected as a diode and said output circuit of said further control transistor, said further control transistor having a control input connected to said junction point.

11. Circuit according to claim 9, wherein said output circuits of said output transistors of said current reflectors and said switchable transistor of said switchable charging current source are connected in series.

12. Circuit according to claim 6, including a voltage divider for level adapting through which said control input of said control transistor is connected to said control voltage terminal.

13. Circuit according to claim 12, wherein said voltage divider includes a series circuit formed of a depletion transistor connected as a resistor and a level transistor connected as a diode defining a first junction point therebetween connected to said control input of said control transistor, and another depletion transistor connected as a resistor and connected in series with said level transistor defining a second junction point therebetween connected to said control voltage terminal.

14. Circuit according to claim 5, including an output driver connected to said circuit output terminal, said control device including a Schmitt trigger with an inverter having an input connected to said external connection terminal and an output, and a driver being connected between said output of said Schmitt trigger with an inverter and the control inputs of said switchable transistor of said charging current source and said switching transistor and being connected to said output driver.

15. Circuit according to claim 14, wherein said voltage controlled transistor network includes a charging and discharging current source, said output driver has an input, said Schmitt trigger with an inverter has an output, and including additional transistors, a switching terminal, a disconnect and switching device controlled through said switching terminal for disconnecting said driver and said charging and discharging current source as far as a signal is concerned and for connecting said input of said output driver to said external connection terminal while connecting the input circuits of the transistors of said current reflector and said output of said Schmitt trigger with an inverter through respective ones of said additional transistors to said reference voltage terminal, and a transistor switching device through which said input of said output driver is switched through from said output of said driver to said external connection terminal.

* * * * *